United States Patent
Fujiwara et al.

(10) Patent No.: US 10,270,045 B2
(45) Date of Patent: Apr. 23, 2019

(54) SEMICONDUCTOR LIGHT-EMITTING ELEMENT

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Takako Fujiwara, Tokyo (JP); Masakazu Sugiyama, Tokyo (JP); Mathew Manish, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/525,055

(22) PCT Filed: Oct. 22, 2015

(86) PCT No.: PCT/JP2015/079803
§ 371 (c)(1),
(2) Date: May 6, 2017

(87) PCT Pub. No.: WO2016/072275
PCT Pub. Date: May 12, 2016

(65) Prior Publication Data
US 2017/0324047 A1 Nov. 9, 2017

(30) Foreign Application Priority Data
Nov. 7, 2014 (JP) .................................. 2014-226912

(51) Int. Cl.
*H01L 51/00* (2006.01)
*H01L 33/24* (2010.01)
(Continued)

(52) U.S. Cl.
CPC .......... *H01L 51/0082* (2013.01); *H01L 33/08* (2013.01); *H01L 33/12* (2013.01);
(Continued)

(58) Field of Classification Search
CPC . H01L 51/0082; H01L 33/62; H01L 51/0081; H01L 33/20; H01L 33/36
See application file for complete search history.

(56) References Cited

U.S. PATENT DOCUMENTS 10,043,944 B2 * 8/2018 Zhang .................... H01L 33/14
2003/0151044 A1 8/2003 Yamada
(Continued)

FOREIGN PATENT DOCUMENTS

CN 102637795 A 8/2012
CN 103746052 A 4/2014
(Continued)

OTHER PUBLICATIONS

International Search Report (ISR) and Written Opinion dated Dec. 15, 2015 issued in International Application No. PCT/JP2015/079803.
(Continued)

*Primary Examiner* — Ahmed N Sefer
(74) *Attorney, Agent, or Firm* — Holtz, Holtz & Volek PC

(57) ABSTRACT

A semiconductor light-emitting element including a first semiconductor layer of a first conductivity type; a first light-emitting layer; a second light-emitting layer; and a second semiconductor layer of a conductivity type opposite to the conductivity type of the first semiconductor layer. The first light-emitting layer has a base layer with composition subject to stress strain from the first semiconductor layer and has a plurality of base segments partitioned into a random net shape; and a first quantum well structure layer composed of at least one quantum well layer and at least one barrier
(Continued)

layer. The second light-emitting layer has a second quantum well structure layer composed of a plurality of barrier layers that have different compositions from that of the at least one barrier layer of the first quantum well structure layer, and at least one quantum well layer.

7 Claims, 4 Drawing Sheets

(51) Int. Cl.

| | |
|---|---|
| *H01L 33/32* | (2010.01) |
| *H01L 33/20* | (2010.01) |
| *H01L 33/36* | (2010.01) |
| *H01L 33/62* | (2010.01) |
| *H01L 33/08* | (2010.01) |
| *H01L 33/12* | (2010.01) |

(52) U.S. Cl.
CPC .............. *H01L 33/20* (2013.01); *H01L 33/24* (2013.01); *H01L 33/32* (2013.01); *H01L 33/36* (2013.01); *H01L 33/62* (2013.01); *H01L 51/0081* (2013.01)

(56) References Cited

U.S. PATENT DOCUMENTS

| | | |
|---|---|---|
| 2005/0056850 A1 | 3/2005 | Taki |
| 2006/0131595 A1 | 6/2006 | Chen |
| 2006/0267026 A1 | 11/2006 | Kim et al. |
| 2007/0145386 A1 | 6/2007 | Lee et al. |
| 2008/0073657 A1 | 3/2008 | Liang et al. |
| 2008/0191190 A1 | 8/2008 | Tsai et al. |
| 2009/0014713 A1* | 1/2009 | Kang ............... H01L 33/24 257/13 |
| 2009/0121214 A1 | 5/2009 | Tu et al. |
| 2009/0173955 A1 | 7/2009 | Kim et al. |
| 2010/0155704 A1* | 6/2010 | Oh ............... H01L 21/0237 257/28 |
| 2010/0244042 A1 | 9/2010 | Saito et al. |
| 2010/0289043 A1 | 11/2010 | Aurelien et al. |
| 2011/0210312 A1 | 9/2011 | Tu et al. |
| 2011/0297955 A1 | 12/2011 | Wang et al. |
| 2012/0056157 A1 | 3/2012 | Hikosaka et al. |
| 2012/0077298 A1 | 3/2012 | Liang et al. |
| 2012/0205618 A1 | 8/2012 | Nakamura |
| 2013/0313517 A1 | 11/2013 | Choi |
| 2013/0320299 A1 | 12/2013 | Li |
| 2015/0179791 A1 | 6/2015 | Kudou |
| 2016/0043279 A1 | 2/2016 | Jean et al. |
| 2017/0317232 A1 | 11/2017 | Togawa et al. |
| 2017/0324048 A1 | 11/2017 | Goto et al. |
| 2018/0033911 A1 | 2/2018 | Fujii et al. |
| 2018/0062037 A1 | 3/2018 | Togawa |

FOREIGN PATENT DOCUMENTS

| | | |
|---|---|---|
| EP | 2642536 A2 | 9/2013 |
| JP | 2004179493 A | 6/2004 |
| JP | 2005093682 A | 4/2005 |
| JP | 2006339646 A | 12/2006 |
| JP | 2008053608 A | 3/2008 |
| JP | 2008071805 A | 3/2008 |
| JP | 2008199016 A | 8/2008 |
| JP | 2008218746 A | 9/2008 |
| JP | 2009124149 A | 6/2009 |
| JP | 2011249460 A | 12/2011 |
| JP | 4984119 B2 | 7/2012 |
| KR | 100809229 B1 | 3/2008 |
| WO | 2012059837 A1 | 5/2012 |
| WO | 2013114152 A1 | 8/2013 |

OTHER PUBLICATIONS

Applied Physics Letters 92, 261909 (2008).
Extended European Search Report (EESR) dated May 11, 2018 issued in counterpart European Application No. 15857023.4.
U.S. Appl. No. 15/525,054; First Named Inventor: Yusaku Fujii; Title: "Semiconductor Light-Emitting Element"; filed May 6, 2017.
U.S. Appl. No. 15/525,056; First Named Inventor: Meiki Goto; Title: "Semiconductor Light-Emitting Element"; filed May 6, 2017.
U.S. Appl. No. 15/525,057; First Named Inventor: Hiroyuki Togawa; Title: "Semiconductor Light-Emitting Element"; filed May 6, 2017.
U.S. Appl. No. 15/561,028; First Named Inventor: Hiroyuki Togawa; Title: "Semiconductor Light-Emitting Element, and Manufacturing Method for Same"; filed Sep. 22, 2017.
Chinese Office Action dated Aug. 28, 2018 (and English translation thereof) issued in counterpart Chinese Application No. 201580060377.9.
European Office Action dated Jan. 24, 2019 issued in counterpart European Application No. 15857023.4.

* cited by examiner (a)

(b)

(c)

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is usually manufactured by growing, on a growth substrate, a semiconductor structure layer composed of an n-type semiconductor layer, an active layer, and a p-type semiconductor layer and forming an n-electrode and a p-electrode that apply voltage to the n-type semiconductor layer and the p-type semiconductor layer, respectively.

Patent Literature 1 discloses a semiconductor light-emitting element including an active layer that is laminated on a substrate and has a surface containing a portion whose inclination angle smoothly changes with respect to the substrate as well as a method of manufacturing the semiconductor light-emitting element. Non-patent Literature 1 discloses a light-emitting diode including an active layer of a multiple quantum well structure where an InGaN layer is laminated on another InGaN layer of a nanostructure with a high indium composition.

CITATION LIST

Patent Literature

Patent Literature 1: Japanese Patent No. 4984119

Non-Patent Literature

Non-Patent Literature 1: Applied Physics Letters 92, 261909 (2008)

SUMMARY OF INVENTION

Technical Problem

Emission of light by a semiconductor light-emitting element is induced when binding (recombination) of an electron and a hole injected into the element through electrodes occurs in the active layer of the element. The wavelength of the light emitted from the active layer (i.e. light-emitting color) differs depending on the band gap of the semiconductor materials that make up the active layer. For example, a light-emitting element using a nitrite-based semiconductor emits blue light from its active layer.

A light source is required to have color rendering properties for, for example, lighting applications. A light source with high color rendering properties is a type of light source that emits near natural light. To achieve high color rendering properties, it is preferable that light emitted from a light source have a wavelength that substantially covers the entire wavelength of the visible region. For example, light extracted from a light source with high color rendering properties is observed as white light.

In this regard, various methods of using a semiconductor light-emitting element to extract white light have been proposed. In one example method of manufacturing a light-emitting device, a wavelength conversion component, such as a phosphor, is mixed into a sealing resin to seal the element by the sealing resin. For example, in the case of a semiconductor light-emitting element using an active layer that emits blue light, a part of blue light from the active layer is converted into yellow light by a phosphor, and the two types of light are mixed and emitted to the outside. The emitted light as a whole is thus observed as white light. Patent Literature 1 proposes a method of widening the light-emitting wavelength without using a phosphor by forming a protrusion-recess pattern using a processing method, such as etching, prior to active layer growth and forming an inclined surface on the active layer.

However, a light-emitting device manufactured using the aforementioned methods has problems relating to the uniformity of the light-emitting wavelength within the device, the complexity of the manufacturing process, and light-emitting intensity. Possible reasons include: addition of a phosphor mixing step; change of the wavelength conversion efficiency of a phosphor over time, addition of a processing step of a semiconductor layer, and deterioration of crystallinity due to processing of a semiconductor layer.

The present invention has been made in view of the aforementioned problems. An object of the present invention is to provide a semiconductor light-emitting element that does not require a wavelength conversion component, such as a phosphor, and that has a light-emitting wavelength band (spectral width) over a wide range of the visible region and has high color rendering properties and a high light-emitting intensity.

Solution to Problem

A semiconductor light-emitting element according to the present invention includes: a first semiconductor layer of a first conductivity type; a first light-emitting layer formed on the first semiconductor layer; a second light-emitting layer formed on the first light-emitting layer; and a second semiconductor layer that is formed on the second light-emitting layer and is of a conductivity type opposite to the conductivity type of the first semiconductor layer. The first light-emitting layer has: a base layer that has a composition subject to stress strain from the first semiconductor layer and has a plurality of base segments partitioned into a random net shape; and a first quantum well structure layer composed of at least one quantum well layer and at least one barrier layer and formed on the base layer, the first quantum well structure layer retaining segment shapes of the plurality of base segments. The second light-emitting layer has a second quantum well structure layer composed of a plurality of barrier layers that have different compositions from that of the at least one barrier layer of the first quantum well structure layer, and at least one quantum well layer, and the second light-emitting layer has a groove, which retains the segment shape, in a surface of an end barrier layer located closest to the first light-emitting layer among the plurality of barrier layers.

DESCRIPTION OF EMBODIMENTS

Figure 1:
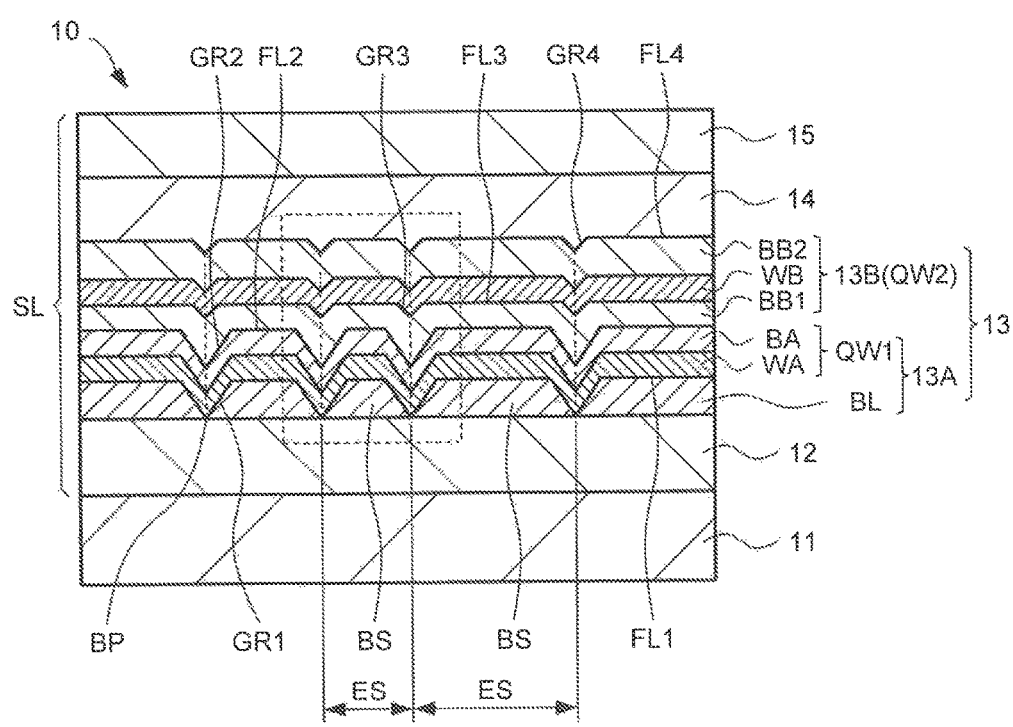
FIG. 1(a) is a cross-sectional view illustrating a structure of a semiconductor light-emitting element according to a first embodiment.
FIG. 1(b) is a schematic top plan view of a base layer of a first light-emitting layer.
Figure 1:
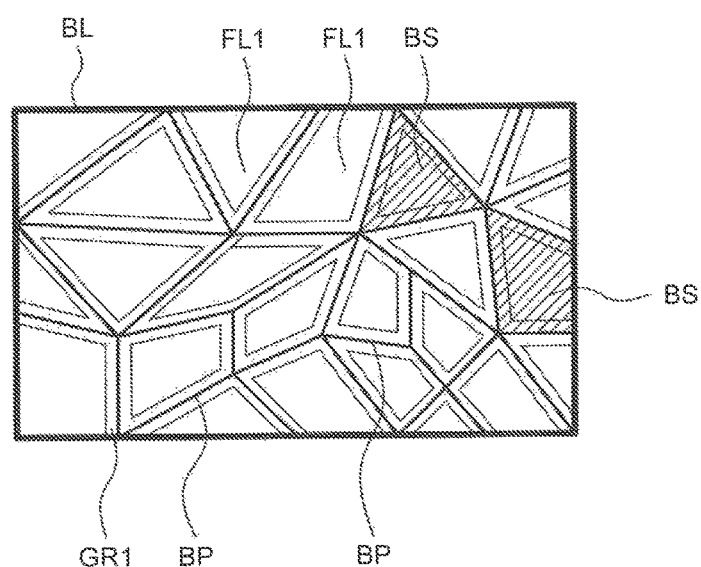

Embodiments of the present invention will now be described in detail hereinbelow. In this specification, an identical reference numeral is assigned to like constituent elements.

First Embodiment

FIG. 1(a) is a cross-sectional view illustrating a structure of a semiconductor light-emitting element (hereinafter, simply referred to as "light-emitting element" or "element" in some cases) 10 according to a first embodiment. In the structure of the semiconductor light-emitting element 10, a semiconductor structure layer SL is formed on a mounting substrate (hereinafter, simply referred to as "substrate" in some cases) 11. The semiconductor structure layer SL includes an n-type semiconductor layer (first semiconductor layer) 12 formed on the mounting substrate 11, a light-emitting functional layer 13 formed on the n-type semiconductor layer 12, an electron blocking layer 14 formed on the light-emitting functional layer 13, and a p-type semiconductor layer (second semiconductor layer whose conductivity type is opposite to the conductivity type of the first semiconductor layer 12) 15 formed on the electron blocking layer 14.

According to the embodiment, the mounting substrate 11 is composed of a growth substrate used for growth of, for example, the semiconductor structure layer SL, and is made of sapphire, for example. In addition, the semiconductor structure layer SL is composed of a nitride-based semiconductor. The semiconductor light-emitting element 10 can be manufactured by growing the semiconductor structure layer SL on the sapphire substrate, for example, whose C-plane surface serves as a crystal growth surface, using the Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

The embodiment is illustrated with reference to the structure of the light-emitting element 10 where the semiconductor structure layer SL is formed on a growth substrate serving as the mounting substrate 11. However, the embodiment is not limited to the structure where the mounting substrate 11 is the growth substrate. For example, the semiconductor light-emitting element 10 may have a structure obtained by first growing the semiconductor structure layer SL on a growth substrate, bonding the semiconductor structure layer SL to another substrate, and removing the growth substrate. In this case, the other substrate thus bonded is formed on the p-type semiconductor layer 15. The aforementioned bonded substrate may use materials with a high degree of heat dissipation, such as, Si, AlN, Mo, W, and CuW.

Although not illustrated in the drawings, a buffer layer (underlayer) may be provided between the mounting substrate 11 and the n-type semiconductor layer 12. The buffer layer is, for example, provided for the purpose of mitigating the strain possibly generated on the interface between the growth substrate and the semiconductor structure layer SL as well as on the interface between layers of the semiconductor structure layer SL. In this embodiment, after a GaN layer is grown on a sapphire substrate (mounting substrate 11) as a buffer layer, the n-type semiconductor layer 12 is laminated.

The n-type semiconductor layer 12 is composed of, for example, a GaN layer containing an n-type dopant (for example, Si). The electron blocking layer 14 is composed of, for example, an AlGaN layer. The p-type semiconductor layer 15 is composed of, for example, a GaN layer containing a p-type dopant (for example, Mg). The n-type semiconductor layer 12 may include a plurality of n-type semiconductor layers with different dopant concentrations. The electron blocking layer 14 may contain a p-type dopant.

In this embodiment, the first and second n-type semiconductor layers (not illustrated) are formed as the n-type semiconductor layer 12. Specifically, the first n-type semiconductor layer is formed on the substrate 11, and the second n-type semiconductor layer whose dopant concentration is smaller than that of the first n-type semiconductor layer is formed on the first n-type semiconductor layer. As the electron blocking layer 14, an AlGaN layer containing a p-type dopant is formed.

The light-emitting functional layer 13 has first and second light-emitting layers 13A and 13B. The first light-emitting layer 13A is formed on the n-type semiconductor layer 12, and the second light-emitting layer 13B is formed on the side of the p-type semiconductor layer 15 (i.e., on the first light-emitting layer 13A in this embodiment) with respect to the first light-emitting layer 13A. The electron blocking layer 14 is formed on the second light-emitting layer 13B. Each of the first and second light-emitting layers 13A and 13B has a quantum well (QW) structure.

The first light-emitting layer 13A has a base layer BL that has a different composition from that of the n-type semiconductor layer 12. The base layer BL has a groove (hereinafter referred to as "first groove") GR1 formed to have a random net shape due to stress strain from the n-type semiconductor layer 12. The first groove GR1 has a mesh shape formed by a plurality of combined grooves created by stress (strain) generated in the base layer BL due to the composition difference between the n-type semiconductor layer 12 and the base layer BL. The stress strain generated in the base layer BL is strain of the crystal structure of the base layer BL caused by the lattice constant difference between the n-type semiconductor layer 12 and the base layer BL.

The first light-emitting layer 13A has a quantum well structure layer (hereinafter referred to as "first quantum well structure layer") QW1 composed of a first quantum well layer WA formed on the base layer BL and a first barrier layer BA. The first quantum well layer WA is formed on the base layer BL, and the first barrier layer BA is formed on the first quantum well layer WA. The base layer BL serves as a barrier layer for the first quantum well layer WA. The first quantum well layer WA is formed as a strained quantum well layer.

A description will now be made for the base layer BL with reference to FIG. 1(b). FIG. 1(b) is a diagram schematically illustrating the upper surface of the base layer BL. The base layer BL is partitioned by the first groove GR1 and has many fine base segments BS formed to have random sizes. Each of the base segments BS is partitioned in a random net shape since the base layer BL has a composition subject to stress strain from the n-type semiconductor layer 12.

The first groove GR1 is composed of groove portions with random and different lengths and shapes. The first groove GR1 is formed in a net (mesh) shape all over the surface of the base layer BL. Each of the base segments BS is a portion (segment) that is randomly partitioned and formed by the first groove GR1 within the base layer BL. Furthermore, the upper surface of each of the second base segments BS2 may have a various shape, such as a substantially round shape, a substantially oval shape, and a polygonal shape.

The first groove GR1 has, for example, a V-shaped cross section (FIG. 1(a)). Also, as illustrated in FIG. 1(b), the first groove GR1 has a line-like bottom portion BP. In this embodiment, an end portion of each of the base segments BS is the bottom portion BP of the first groove GR1. Each of the base segments BS adjoins another base segment BS at the bottom portion BP.

Further, the base layer BL has a flat portion (hereinafter referred to as "first flat portion") FL1, which corresponds to each of the base segments BS. The surface of the base layer BL is composed of the first flat portion FL1 and the inner wall surface of the first groove GR1. Each of the first flat portions FL1 is partitioned by the first groove GR1 for each base segment BS. The base segment BS has an upper surface composed of the first flat portion FL1 and side surfaces composed of the inner wall surfaces of the first groove GR1.

In other words, the first flat portion FL1 constitutes the upper surface of each of the base segments BS, and the inner wall surface of the first groove GR1 constitutes the side surface of the base segment BS. Each of the base segments BS thus has an inclined side surface and has a cross section with, for example, a substantially trapezoidal shape.

With reference to FIG. 1(a) again, the first light-emitting layer 13A has, on its surface, a groove (hereinafter referred to as "second groove") GR2 that is formed to inherit (i.e. maintain) various the shape of the first groove GR1 and has the same mesh shape as that of the first groove GR1. Specifically, as illustrated in FIG. 1(a), the first quantum well layer WA and the first barrier layer BA are formed on the base layer BL with the segmental shape of the base segment BS remained. Thus, the first quantum well layer WA and the first barrier layer BA have a groove at a location corresponding to each groove portion of the first groove GR1 of the base layer BL. A groove formed in the first barrier layer BA, which is the nearest layer to the p-type semiconductor layer 15, is the second groove GR2.

The portion of the surface of the first light-emitting layer 13A, i.e. the surface of the first barrier layer BA, other than the second groove GR2 is formed as a flat portion (hereinafter, referred to as "second flat portion") FL2. Each of the second flat portions FL2 is formed so that its location and shape correspond to those of each of the first flat portions FL1.

In other words, the first light-emitting layer 13A has the second flat portion FL2 and the second groove GR2 on its surface. The second groove GR2 is formed so as to partition the first light-emitting layer 13A into a plurality of island-shaped light-emitting segments ES. Each of the light-emitting segments ES is formed so as to correspond to each of the base segments BS. The first light-emitting layer 13A thus has a plurality of light-emitting segments ES partitioned into a random net shape. The sizes and shapes of the light-emitting segments ES are randomly varied and distributed and randomly disposed (arranged) on the surface of the first light-emitting layer 13A.

The second light-emitting layer 13B is formed on the first light-emitting layer 13A. The second light-emitting layer 13B has a quantum well structure layer (hereinafter referred to as "second quantum well structure layer") QW2 composed of two barrier layers (hereinafter referred to as "second barrier layer") BB1 and BB2 and a quantum well layer (hereinafter referred to as "second quantum well layer") WB. Each of the second barrier layers BB1 and BB2 has a different composition from those of the base layer BL of the first light-emitting layer 13A and the first barrier layer BA of the first quantum well structure layer QW1. In this embodiment, the second barrier layers BB1 and BB2 have the same composition as those of the n-type semiconductor layer 12 and the p-type semiconductor layer 15. The second quantum well layer WB is formed as a strained quantum well layer.

Among the second barrier layers BB1 and BB2, the barrier layer of one end (hereinafter referred to as "first end barrier layer") BB1 which is located closest to the first light-emitting layer 13A has a groove (hereinafter referred to as "third groove") GR3 formed to inherit (or maintain) the shape of the second groove GR2. The third groove GR3 has a smaller and deeper groove portion than those of the first and second grooves GR1 and GR2. In other words, on the surface of the first end barrier layer BB1, the third groove GR3 that retains the segment shape of the base segment BS is formed. The first end barrier layer BB1 has a flat portion (hereinafter referred to as "third flat portion") FL3 corresponding to each of the base segments BS.

The second light-emitting layer 13B has, on its surface, a groove (hereinafter referred to as "fourth groove") GR4 formed to inherit the shape of the third groove GR3. In other words, the second barrier layer BB2 and the second quantum well layer WB of the second light-emitting layer 13B are formed to inherit the shape of the first end barrier layer BB1. The fourth groove GR4 is smaller-sized and shallower than the third groove GR3. The portion of the surface of the second light-emitting layer 13B, i.e. the surface of the second barrier layer BB2, other than the fourth groove GR4 is formed as a flat portion (hereinafter, referred to as "fourth flat portion") FL4.

As described above, in a top plan view of each of the first to fourth grooves GR1 to GR4 (in other words, view perpendicular to the crystal growth surface), the grooves have their respective bottom portions at the same location. The segment shape of the light-emitting segment ES formed on the first light-emitting layer 13A is substantially inherited by the second light-emitting layer 13B. Thus, in this embodiment, the light-emitting functional layer 13 is entirely partitioned into a plurality of light-emitting segments ES by the first to fourth grooves GR1 to GR4.

Figure 2:
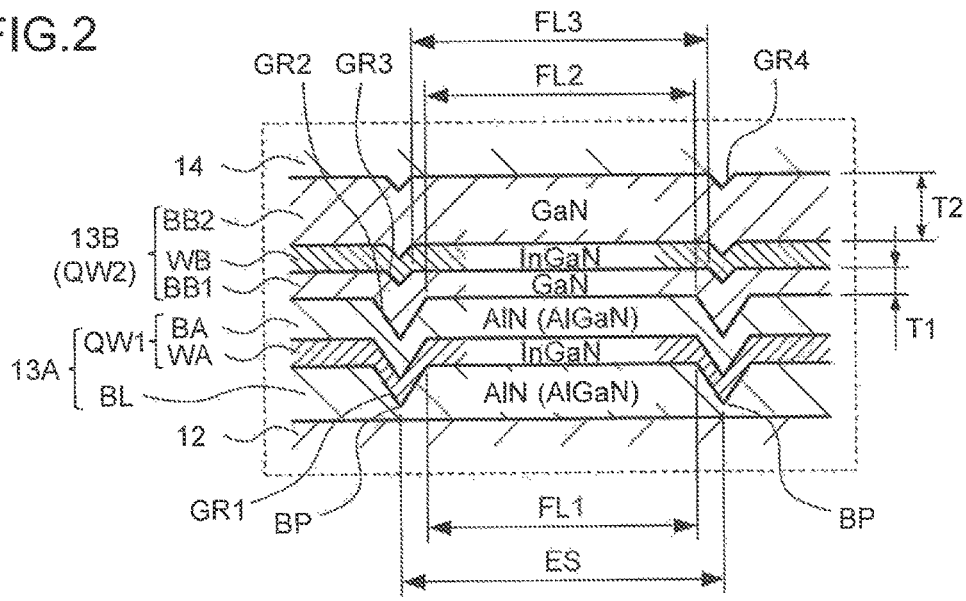
FIG. 2 is a cross-sectional view illustrating a structure of a light-emitting layer of the semiconductor light-emitting element according to the first embodiment.

FIG. 2 is a cross-sectional view illustrating the structure of the light-emitting functional layer 13. With reference to FIG. 2, a description will be given in detail of the first and second light-emitting layers 13A and 13B of the light-emitting functional layer 13. In the first light-emitting layer 13A, the base layer BL and the first barrier layer BA have a composition of AlN or AlGaN. In this embodiment, an AlN layer is formed as the base layer BL and the first barrier layer BA. The first quantum well layer WA of the first light-emitting layer 13A has a composition of InGaN. The base layer BL serves as a barrier layer of the first light-emitting layer 13A.

In the second light-emitting layer 13B, each of the second barrier layers BB1 and BB2 has a composition of GaN. The second quantum well layer WB has a composition of InGaN. In other words, the first and second light-emitting layers 13A and 13B, each of which has a quantum well structure, have barrier layers with different compositions. Therefore, the band gap of the second quantum well layer WB is different from that of the first light-emitting layer WA. Here, the band gap of a quantum well structure denotes the energy between the quantum levels of the quantum well layer.

A layer thickness T1 of the first end barrier layer BB1 is smaller than the layer thickness of another end barrier layer (hereinafter referred to as "second end barrier layer") BB2, which is located closest to the p-type semiconductor layer 15 of the second barrier layers BB1 and BB2. Specifically, the layer thickness T1 of the first end barrier layer BB1 is smaller than a layer thickness T2 of the second end barrier layer BB2. The third groove GR3 is smaller-sized and shallower than the first and second grooves GR1 and GR2. Within the same light-emitting segment ES, the third flat portion FL3 is thus larger-sized than the second flat portion FL2.

A description will now be made for the first light-emitting layer 13A. In this embodiment, the base layer BL is composed of an AlN layer. The base segment BS (i.e., the first groove GR1) of the base layer BL can be formed, for example, by growing an AlN layer serving as the base layer BL on the n-type semiconductor layer 12 at a relatively low temperature.

More specifically, when a base layer BL different from the n-type semiconductor layer 12 in terms of crystal composition is grown on the n-type semiconductor layer 12, stress (strain) is generated in the base layer BL. For example, the base layer BL has a smaller lattice constant than that of the n-type semiconductor layer 12. For example, when an AlN layer serving as the base layer BL is formed on a GaN layer serving as the n-type semiconductor layer 12, tensile strain is generated in the AlN layer due to the GaN layer. Thus, tensile stress is generated in the AlN layer during its growth. When the AlN layer is grown on the GaN layer, a groove is formed in the AlN layer at the beginning of or during its growth, and the AlN layer grows in a three-dimensional manner. Accordingly, the AlN layer is grown in a stereoscopic manner, and a plurality of fine protrusions and recesses are formed. The starting point of formation of this groove is the bottom portion BP of the first groove GR1.

When the AlN layer is grown on the GaN layer at a low temperature, three-dimensional growth of the AlN layer is promoted. Thus, a large number of groove portions are formed (the first groove GR1 is formed) on the surface of the AlN layer while being combined with each other, whereby the surface of the AlN layer is partitioned into a plurality of segments. The base layer BL with the plurality of base segments BS can thus be formed. In this embodiment, the AlN layer is formed as the base layer BL at a growth temperature of 780° C.

When an InGaN layer serving as the first quantum well layer WA is formed on the base layer BL, the first quantum well layer WA is formed as a strained quantum well layer. Also, a certain distribution of the In content is generated within the first quantum well layer WA. In other words, the first quantum well layer WA is formed such that the region on the first flat portion FL1 differs from the region on the first groove GR1 in terms of In composition. The layer thickness of the first quantum well layer WA on the upper surface of the base segment BS is different from that on the side surface of the base segment BS. Thus, the band gap is not constant within the layer of the first quantum well layer WA.

By forming the first barrier layer BA (AlN layer) that has the second groove GR2 so as to maintain the shape of the first groove GR1, the first light-emitting layer 13A is formed. Accordingly, due to its random shape and band gap structure, the light-emitting segments ES partitioned in the first light-emitting layer 13A emit light of various wavelengths. In this embodiment, the first light-emitting layer 13A emits light whose wavelength widely covers a near green region. As the first light-emitting layer 13A has fine island-shaped protrusions and recesses, the first light-emitting layer 13A emits various colors of light. The inventors confirmed that the first light-emitting layer 13A according to this embodiment emits light whose spectral bandwidth covers a wide wavelength range of approximately 450 to 650 nm.

In this embodiment, the base layer BL has the first flat portion FL1, and the surface of the first light-emitting layer 13A has the second flat portions FL2. The first light-emitting layer 13A has the second flat portion FL2 on a region of the first flat portion FL1, whereby a preferable level of crystallinity is ensured within the first light-emitting layer 13A.

In this embodiment, the case where the surfaces of the base layer BL and the first light-emitting layer 13A are composed of the flat portion and the groove was described. However, the surface configurations of the base layer BL and the first light-emitting layer 13A are not limited to the aforementioned case. For example, the base layer BL may have a curved surface portion on the upper surface of the base segment BS.

As the size of the base segment BS decreases, the amount of In introduced into the quantum well layer WA increases, and the light-emitting wavelength shifts toward the longer wavelength side. Specifically, when an InGaN layer serving as the quantum well layer WA is formed on an AlN layer serving as the base layer BL, the AlN layer exerts compressive stress (compressive strain) on the InGaN layer. When the InGaN layer is subject to compressive strain, In is readily introduced into the first quantum well layer WA. The band gap of the InGaN layer, i.e., the energy between quantum levels, thereby decreases. The first quantum well layer WA emits light with a light-emitting wavelength of the longer wavelength side.

Also, the present inventors examined formation of not a light-emitting layer like the first light-emitting layer 13A, but of a multiple quantum well structure having a plurality of quantum well layers which have one flat surface and in which the In composition is changed differently from one another. However, the range of the In composition that can be formed is limited. In the case of a light-emitting element having a light-emitting layer of a multiple quantum well structure with In compositions changed, the spectrum with a wavelength band as wide as that of the light-emitting element 10 of this embodiment was not possible. Specifically, light with a constant wavelength in a wide range and a certain level of intensity was not acquired.

Accordingly, light with high color rendering properties could not be acquired by simply increasing the In composition. When a quantum well layer with an excessively large In composition was formed to change the In composition in a wide range, segregation of In was noticeable, and In precipitated and blackened. Also, a portion that does not function as a light-emitting layer was formed. Thus, it can be said that there is a limit in the effort to simultaneously achieve a wider light-emitting spectrum and a higher light-emitting intensity based on the In composition.

In another example examination, the present inventors manufactured a light-emitting element by laminating light-emitting layers that are formed of different materials and have different band gaps. Simply laminating materials of different types to produce a light-emitting layer only produced light whose peak wavelength corresponds to the band gap, and the spectral intensity between the peaks was small. Acquisition of white light was difficult since colors were mixed in an unbalanced and unstable manner. A step of forming light-emitting layers containing different types of materials was added, and the resulting product did not have a preferable level of crystallinity. In this embodiment, on the other hand, by forming a light-emitting functional layer 13 having a first quantum well layer WA of a microstructure, light that has a light-emitting wavelength band (half-value width) over a wide range of the visible region was readily and certainly achieved.

A description will next be made for the second light-emitting layer 13B. The second light-emitting layer 13B is formed on the first light-emitting layer 13A and inherits the shape of the first light-emitting layer 13A. Specifically, the layer thickness T1 of the first end barrier layer BB1 is smaller than a typical layer thickness of the barrier layer (for example, the layer thickness T2 of the second end barrier layer BB2). Accordingly, the third groove GR3 corresponding to the second groove GR2 is formed in the surface of the first end barrier layer BB1. Also, the fourth groove GR4 is formed in the surface of the second light-emitting layer 13B.

In other words, the second light-emitting layer 13B inherits the segment shape of the light-emitting segment ES corresponding to the base segment BS. The second light-emitting layer 13B thus has randomly formed grooves in the surface. Therefore, the spectral width in this case is wider than that in the case of simply forming a flat light-emitting layer.

According to the embodiment, the second barrier layers BB1 and BB2 have the same composition as that of the n-type semiconductor layer 12 and have a composition different from that of the first barrier layer BA of the first light-emitting layer 13A. The tensile strain from the n-type semiconductor layer 12 to the first light-emitting layer 13A is mitigated by the second light-emitting layer 13B. The first end barrier layer BB1 of the second light-emitting layer 13B inherits the shape of the second groove GR2 formed in the first barrier layer BA and is formed to partially embed the second GR2. The third groove GR3 formed in the surface of the first end barrier layer BB1 is formed so as to be shallower and smaller than the second groove GR2. By forming the second light-emitting layer 13B on the first light-emitting layer 13A, the effect of strain exerted by the n-type semiconductor layer 12 on the entire light-emitting functional layer 13 can be suppressed.

The second barrier layers BB1 and BB2 have a different composition from that of the first barrier layer BA of the first light-emitting layer 13A. Thus, with respect to the first light-emitting layer 13A and the second light-emitting layer 13B, the band gap, i.e., the energy between quantum levels, differs between the quantum well layers WA and WB thereof. It is thereby possible to emit light with different light-emitting intensity peaks and a wide spectral width near the peaks. For example, according to this embodiment, the first light-emitting layer 13A emits light in a wide wavelength bandwidth range in the green region, and the second light-emitting layer 13B emits light in a wide wavelength bandwidth range in the blue region.

According to the embodiment, each of the second barrier layers BB1 and BB2 has a GaN composition, and the second quantum well layer WB has an InGaN composition. The present inventors confirmed that the second light-emitting layer 13B thus configured emits light whose spectral width ranges from 420 to 450 nm. On the other hand, when a flat light-emitting layer was simply formed, the light-emitting layer emitted light with an intensity peak in the blue region (around 420 nm) and emitted light with an extremely small intensity in the neighborhood of the aforementioned wavelength region.

According to the embodiment, the case where the fourth groove GR4 is formed in the surface of the second light-emitting layer 13B is described. However, the embodiment is not limited to the case where the second light-emitting layer 13B has, on the surface thereof, the fourth groove GR4. In the first end barrier layer BB1 of the second light-emitting layer 13, a groove that retains the segment shape of the base segment BS (third groove GR3) is desirably formed. For example, the second quantum well layer WB and the second end barrier layer BB2 may have a flat-shaped surface. For example, a flat surface can be formed by, for example, increasing the layer thicknesses of the second quantum well layer WB and the second end barrier layer BB2.

As one example embodiment, the present inventors formed a light-emitting functional layer 13 with the following layer thicknesses: The base layer BL has a layer thickness of 4 nm. The first quantum well layer WA has a thickness of 3 nm. The first barrier layer BA has a layer thickness of 4 nm. The first end barrier layer BB1 has the layer thickness T1 of 3 nm or 6 nm. The second quantum well layer WB has a layer thickness of 3 nm. The second end barrier layer BB2 has a layer thickness of 12 nm. The size of the base segment BS, i.e., the size of the light-emitting segment ES in the in-plane direction, ranges from several tens nm to several μm.

In the embodiment, an n-GaN layer serving as the n-type semiconductor layer 12 was formed at a growth temperature of 1130° C. Also, the first light-emitting layer 13A was formed at a growth temperature of 780° C., and the second light-emitting layer 13B was formed at a growth temperature of 780° C. Further, an AlGaN layer serving as the electron blocking layer 14 was formed at a growth temperature of 980° C., and a p-GaN layer serving as the p-type semiconductor layer 15 was formed at a growth temperature of 1020° C.

In general, electrons and holes recombine in an area of the light-emitting functional layer 13 close to the p-type semiconductor layer 15. Specifically, since the mobility of an electron is higher than that of a hole, the electrons and the holes are more likely to recombine on the side where the holes are injected, i.e., on the side closer to the p-type semiconductor layer 15. Thus, light with a relatively high light-emitting intensity can be obtained from the second light-emitting layer 13B, which is close to the p-type semiconductor layer 15. A lower light-emitting intensity of light from the first light-emitting layer 13A is of concern.

However, in the embodiment, the aforementioned concern can be addressed by decreasing the layer thickness T1 of the first end barrier layer BB1 to a relatively small value. Specifically, by decreasing the layer thickness T1, the likelihood increases that holes are injected to the first light-emitting layer 13A through the first end barrier layer BB1. Accordingly, the first light-emitting layer 13A can emit light with a high intensity.

First Modified Example

Figure 3:
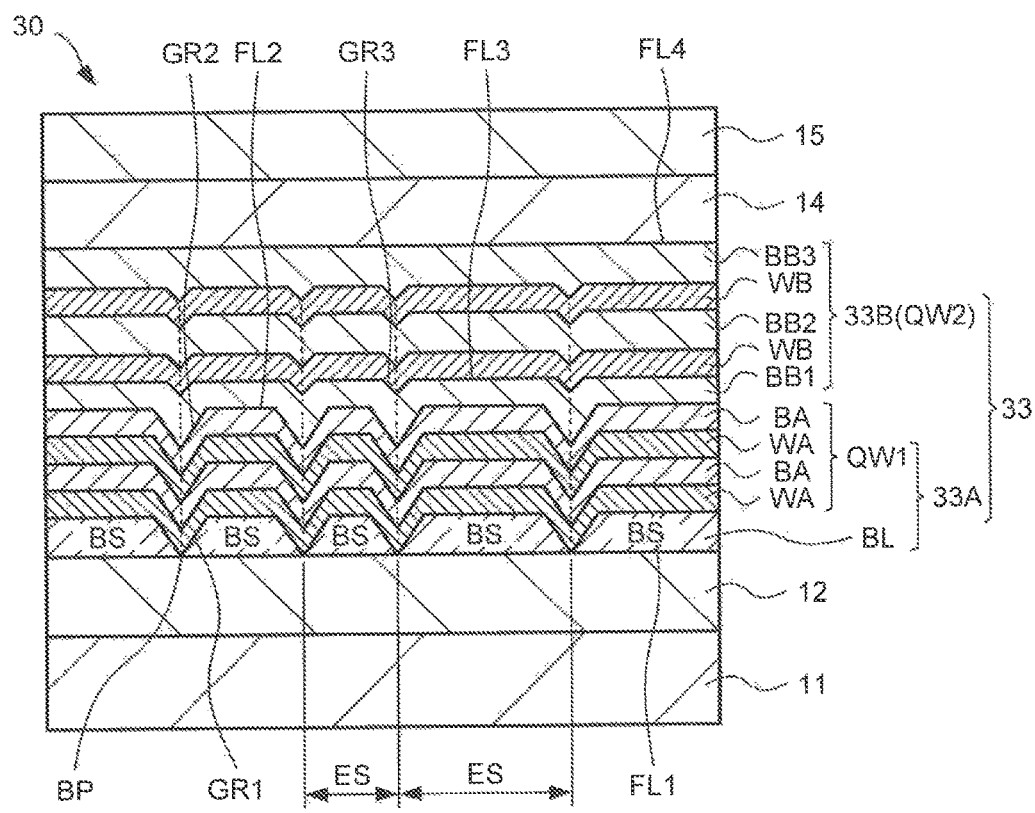
FIG. 3 is a cross-sectional view illustrating a structure of a semiconductor light-emitting element according to a first modified example of the first embodiment.

FIG. 3 is a cross-sectional view illustrating a structure of a semiconductor light-emitting element 30 according to a first modified example of the first embodiment. Except for the structure of a light-emitting functional layer 33, the configuration of the light-emitting element 30 is the same as that of the light-emitting element 10. The light-emitting functional layer 33 of the light-emitting element 30 has first and second light-emitting layers 33A and 33B which have a multiple quantum well (MQW) structure. The first light-emitting layer 33A has, for example, two first quantum well layer WA, and the second light-emitting layer 33B has two second quantum well layers WB.

Specifically, on the base layer BL, the first light-emitting layer 33A has a quantum well structure layer QW1 of a multiple quantum well structure where two first quantum well layers WA and two first barrier layers BA are alternately laminated. The second light-emitting layer 33B has a quantum well structure layer QW2 of a multiple quantum well structure where two second quantum well layers WB are formed so as to be held between three second barrier layers BB1, BB2, and BB3. The configuration of the second barrier layer BB3 is the same as that of the second barrier layer BB2.

In this modified example, the second barrier layer BB1, which is located closest to the n-type semiconductor layer 12 (the first light-emitting layer 33A) among the second barrier layers BB1 to BB3 of the second light-emitting layer 33B, is a first end barrier layer. The second barrier layer BB3, which is located closest to the p-type semiconductor layer 15, is a second end barrier layer.

In this modified example, the first and second light-emitting layers 33A and 33B have a multiple quantum well structure. The wavelength bandwidth of light emitted from the light-emitting layer 33 is thus widened. More specifically, the number of spectral peaks of the wavelength of light emitted from the light-emitting functional layer 33 increases. In this modified example, a spectrum with four peaks can be achieved. Accordingly, the advantageous effect of widening of the light-emitting wavelength range and an increase in the intensity thereof is further enhanced.

In this modified example, the case where both the first and second light-emitting layers 33A and 33B have a multiple quantum well structure has been illustrated. However, both the first and second light-emitting layers 33A and 33B do not have to have a multiple quantum well structure. For example, the first light-emitting layer may have a multiple quantum well structure as in the case of the first light-emitting layer 33A of this modified example, and the second light-emitting layer may have a single quantum well structure as in the case of the first light-emitting layer 13B of the first embodiment. Further, the number of layers of each quantum well layer may be three or greater.

In other words, the first light-emitting layer may have a quantum well structure where at least one first quantum well layer and at least one first barrier layer are laminated on the base layer BL. In addition, the second light-emitting layer may have a quantum well structure where at least one second quantum well layer is laminated so as to be held between a plurality of second barrier layers. Of the plurality of second barrier layers of the second light-emitting layer, the first end barrier layer BB1, which is located closest to the n-type semiconductor layer 12, have the third groove GR3 corresponding to the first and second grooves GR1 and GR2 of the first light-emitting layer.

As illustrated in FIG. 3, in this modified example, a groove is not formed in the surface of the second light-emitting layer 33B. The entire surface is configured to be the flat portion FL4. In other words, the second light-emitting layer 33B is formed by embedding, in the surface thereof, the first and second grooves GR1 and GR2 formed in the first light-emitting layer 33A. The reason is that among the second barrier layers BB1, BB2, and BB3 of the second light-emitting layer 33B, the second barrier layers BB2 and BB3 other than the first end barrier layer BB1 have a relatively large layer thickness.

Second Modified Example

Figure 4:
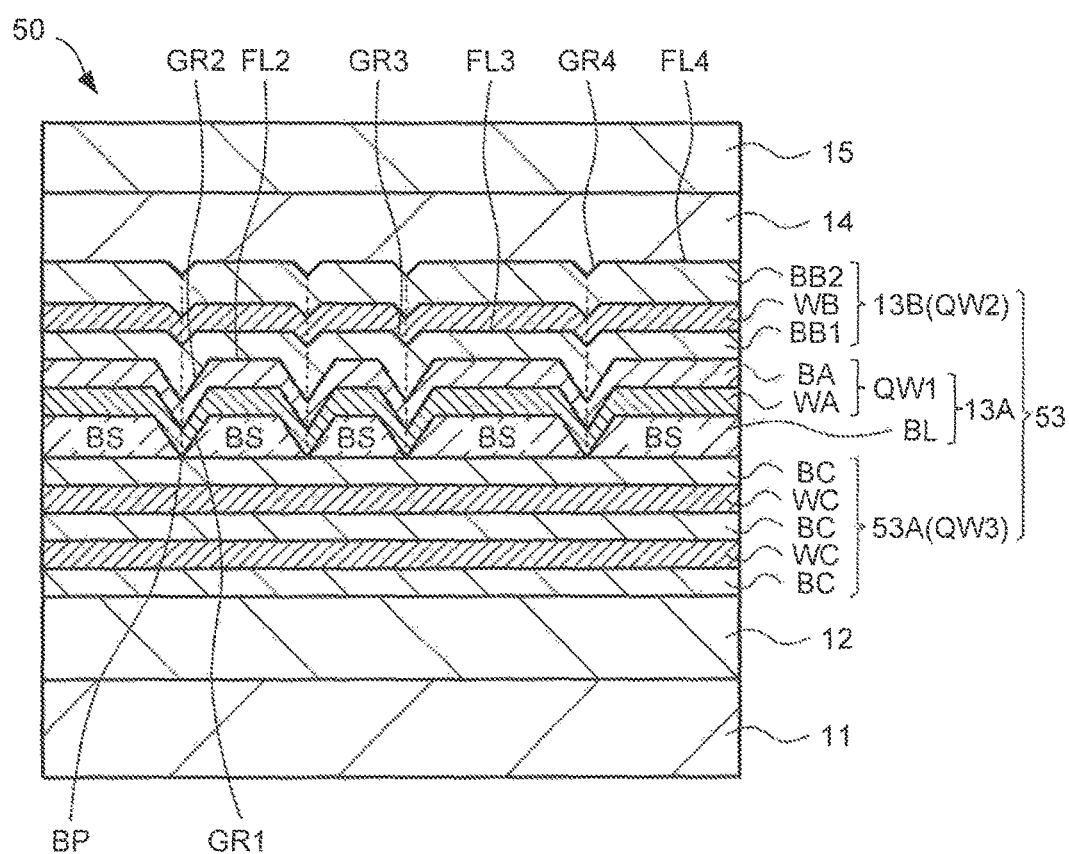
FIG. 4 is a cross-sectional view illustrating a structure of a semiconductor light-emitting element according to a second modified example of the first embodiment.

FIG. 4 is a cross-sectional view illustrating a structure of a semiconductor light-emitting element 50 according to a second modified example of the first embodiment. Except for the structure of the light-emitting functional layer 53, the configuration of the light-emitting element 50 is the same as that of the light-emitting element 10 or 30. Between the n-type semiconductor layer 12 and the first light-emitting layer 13A of the light-emitting element 10, the light-emitting functional layer 53 of the light-emitting element 50 has a third light-emitting layer 53A having a third quantum well structure layer QW3 of a multiple quantum well structure composed of at least one third quantum well layer WC and a plurality of third barrier layers BC.

In this modified example, in the structure of the third light-emitting layer 53A, two third quantum well layers WC and three third barrier layers BC are alternately laminated on the n-type semiconductor layer 13. On the third barrier layer BC, which is closest to the p-type semiconductor layer 15, the first light-emitting layer 13A (base layer BL) is formed. The composition of each of the third quantum well layers WC is the same as that of the second quantum well layer WB, for example, an InGaN composition. The composition of each of the third barrier layers BC has the same as those of the second barrier layers BB1 to BB3, for example, a GaN composition. In other words, the third light-emitting layer 53A has the same composition as that of, for example, the second light-emitting layer 13B or 33B.

In the configuration of this modified example, the third quantum well structure layer QW3 is added to the side of the n-type semiconductor layer 12 of the light-emitting functional layer 13 of the light-emitting element 10 of the first embodiment. Compared with the first embodiment, additional light with a light-emitting wavelength peak in a pure blue region can be readily emitted. The configuration according to this modified example is advantageous for, for example, increasing the light intensity in the blue region.

Figure 5:
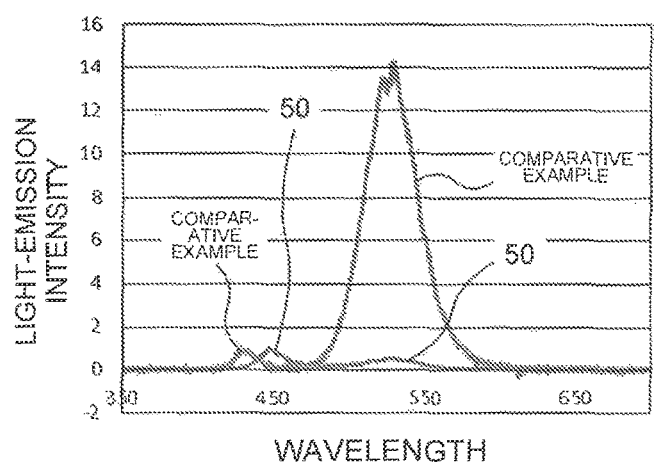
FIGS. 5(a) to (c) are spectrum diagrams of the semiconductor light-emitting element according to the second modified example of the first embodiment and a semiconductor light-emitting element according to a comparative example.
Figure 5:
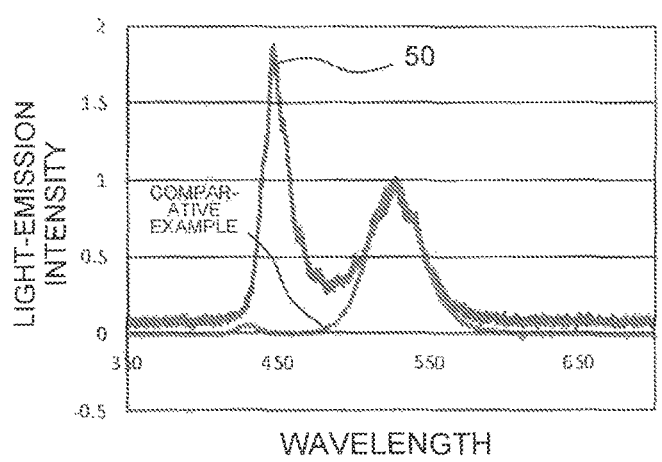
Figure 5:
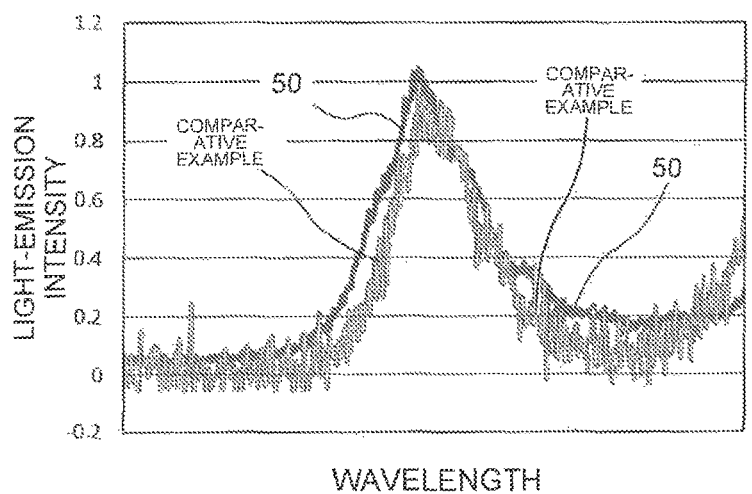

FIGS. 5(a) to 5(c) illustrate a spectrum obtained from the light-emitting element 50 according to this modified example. FIGS. 5(a) to 5(c) illustrate the spectra obtained from the element 50 of the second modified example of the first embodiment and the spectra of a comparative example. For the comparative example, a light-emitting element was prepared so that this light-emitting element differs from the light-emitting element 50 in that the former does not have the second light-emitting layer 13B. Schematically speaking, in this modified example, blue light is emitted from both the second light-emitting layer 13B and the third light-emitting layer 53A. In the comparative example, blue light is emitted only from the third light-emitting layer 53A.

FIG. 5(a) is a view of spectra standardized by the intensity of emitted blue light. The compositions are the same in this modified example, but the spectrum of the blue region is shifted toward the longer wavelength side. FIG. 5(b) is a view of spectra standardized by the light-emitting intensity of the element of the comparative example. Comparison of the light-emitting intensity of the comparative example and this modified example illustrates that the intensity of the blue component of this modified example is higher. FIG. 5(c) is a view of spectra which are standardized by the light-emitting intensity of the element of the comparative example and whose peak locations are identical. As illustrated in FIG. 5(c), the half-value width of this modified example is wider than that of the comparative example. It was confirmed on the basis of the foregoing results that the color rendering properties of the white color element of this modified example become greater than the color rendering properties of the comparative example.

This modified example can be combined with the first modified example. More specifically, the third light-emitting layer 53A can be further added to the light-emitting element 30, which has the first and second light-emitting layers 33A and 33B of a multiple quantum well structure. By combining the first and second modified examples, the spectrum can be adjusted at a high degree of freedom. An element applicable to various uses can be produced.

The case of forming the electron blocking layer 14 between the light-emitting functional layer 13 (or 33 and 53) and the p-type semiconductor layer 15 has been illustrated in this embodiment and the modified examples thereof. However, this embodiment and the modified examples thereof are not limited to the case of providing the electron blocking layer 14. For example, the p-type semiconductor layer 15 may be formed on the light-emitting functional layer 13. Also, the electron blocking layer 14 has a larger band gap than those of the n-type semiconductor layer 12, the light-emitting functional layer 13, and the p-type semiconductor layer 15. Accordingly, electrons can be prevented from overflowing to the side of the p-type semiconductor layer 15 through the light-emitting functional layer 13. Thus, it is preferable to dispose the electron blocking layer 14 for large-current driving and high-temperature operation.

In this embodiment and the modified examples thereof, the first light-emitting layer 13A has: the base layer BL that has a composition subject to stress strain from the n-type semiconductor layer 12 and has a plurality of base segments BS that are partitioned into a random net shape; and the first quantum well structure layer QW1 composed of at least one quantum well layer WA formed on the base layer BL and at least one barrier layer BA, wherein the at least one quantum well layer WA retains the segment shapes of the plurality of base segments BS. The second light-emitting layer 13B has the second quantum well structure layer QW2 composed of a plurality of barrier layers BB1 and BB2 whose compositions differ from that of the barrier layer BA of the first quantum well structure layer QW1, and at least one quantum well layer WB. In the surface of the end barrier layer BB1, which is located closest to the first light-emitting layer 13A among the plurality of barrier layers BB1 and BB2, the second light-emitting layer 13B has the groove GR3 that retains the segment shape. Accordingly, it is possible to provide a light-emitting element that can emit light with a high light-emitting intensity over a wide range of the visible region.

In this embodiment, the case where the first conductivity type is an n-conductivity type and the second conductivity type is a p-conductivity type, which is opposite to the n-conductivity type. However, the first conductivity type may be a p-type, and the second conductivity type may be an n-type.

REFERENCE NUMERALS LIST 10, 30, 50 semiconductor light-emitting element
12 n-type semiconductor layer (first semiconductor layer)
13, 33, 53 light-emitting functional layer
13A, 33A first light-emitting layer
13B, 33B second light-emitting layer
53A third light-emitting layer
QW1, QW2, QW3 quantum well structure layer 14 electron blocking layer
15 p-type semiconductor layer (second semiconductor layer)
BL base layer
BS base segment
ES light-emitting segment
GR1 to GR4 first to fourth grooves

The invention claimed is:

1. A semiconductor light-emitting element comprising:
   a first semiconductor layer of a first conductivity type;
   a first light-emitting layer formed on the first semiconductor layer;
   a second light-emitting layer formed on the first light-emitting layer; and
   a second semiconductor layer that is formed on the second light-emitting layer and is of a conductivity type opposite to the conductivity type of the first semiconductor layer,
   wherein:
   the first light-emitting layer has: (i) a base layer that has a composition subject to stress from the first semiconductor layer, the base layer having a groove formed to have a random net shape and a plurality of base segments partitioned by the groove; and (ii) a first quantum well structure layer composed of at least one quantum well layer and at least one barrier layer and formed on the base layer, the first quantum well structure layer retaining segment shapes of the plurality of base segments, and
   the second light-emitting layer has a second quantum well structure layer composed of a plurality of barrier layers that have different compositions from that of the at least one barrier layer of the first quantum well structure layer, and at least one quantum well layer, and the second light-emitting layer has a groove, which retains the segment shapes of the plurality of base segments, in a surface of an end barrier layer located closest to the first light-emitting layer among the plurality of barrier layers.

2. The semiconductor light-emitting element according to claim 1, wherein:
   the first semiconductor layer has a GaN composition;
   the base layer and the barrier layer of the first quantum well structure layer has an AlN or AlGaN composition;
   each of the plurality of barrier layers of the second quantum well structure layer has a GaN composition; and
   each of the at least one quantum well layer of the first quantum well structure layer and the at least one quantum well layer of the second quantum well structure layer has an InGaN composition.

3. The semiconductor light-emitting element according to claim 1, wherein the end barrier layer has a smaller layer thickness than that of an end barrier layer which is located closest to the second semiconductor layer among the plurality of barrier layers of the second quantum well structure layer.

4. The semiconductor light-emitting element according to claim 1, further comprising:
   in a surface of the second light-emitting layer, a groove that retains the segment shapes of the plurality of base segments.

5. The semiconductor light-emitting element according to claim 4, wherein the first quantum well structure layer has a multiple quantum well structure.

6. The semiconductor light-emitting element according to claim 1, wherein the second quantum well structure layer has a multiple quantum well structure.

7. The semiconductor light-emitting element according to claim 1, further comprising:
   a third light-emitting layer formed between the first semiconductor layer and the first light-emitting layer, the third light-emitting layer having a third quantum well structure layer composed of a plurality of barrier layers and at least one quantum well layer.

* * * * *